United States Patent
Rubio Guivernau et al.

(10) Patent No.: US 9,739,940 B2
(45) Date of Patent: Aug. 22, 2017

(54) BIDIRECTIONAL PHOTONIC INTEGRATED CIRCUIT WITH SUPPRESSED REFLECTION

(71) Applicant: Medlumics S.L., Madrid (ES)

(72) Inventors: José Luis Rubio Guivernau, Madrid (ES); Juan Sancho Durá, Canals (ES); Eduardo Margallo Balbás, Madrid (ES)

(73) Assignee: Medlumics S.L., Madrid (ES)

( * ) Notice: Subject to any disclaimer, the term of this patent is extended or adjusted under 35 U.S.C. 154(b) by 0 days.

(21) Appl. No.: 15/065,126

(22) Filed: Mar. 9, 2016

(65) Prior Publication Data

US 2016/0266311 A1   Sep. 15, 2016

Related U.S. Application Data

(60) Provisional application No. 62/132,038, filed on Mar. 12, 2015.

(51) Int. Cl.
*H01S 5/00* (2006.01)
*G02B 6/12* (2006.01)
(Continued)

(52) U.S. Cl.
CPC ............. *G02B 6/122* (2013.01); *G02B 6/12* (2013.01); *G02B 6/12004* (2013.01);
(Continued)

(58) Field of Classification Search
CPC ..... H01S 3/10007; H01S 5/0085; G02B 6/12; G02B 6/122; G02B 6/12004; G02B 2006/12142; G02B 2006/12159
See application file for complete search history.

(56) References Cited

U.S. PATENT DOCUMENTS

| 5,377,036 A | 12/1994 | Appel et al. |
| 7,983,318 B2 | 7/2011 | Hayakawa |

(Continued)

FOREIGN PATENT DOCUMENTS

| JP | S63160391 | 7/1988 |
| WO | WO 2006/004743 | 1/2006 |

OTHER PUBLICATIONS

International Search Report directed to related International Patent Application No. PCT/EP2016/055117, mailed Jun. 13, 2016; 4 pages.

(Continued)

*Primary Examiner* — Eric Bolda
(74) *Attorney, Agent, or Firm* — Sterne, Kessler, Goldstein & Fox P.L.L.C.

(57) ABSTRACT

A photonic integrated circuit is presented that includes a substrate, and a first and second waveguide patterned on the substrate. The first waveguide guides an input beam of radiation. The photonic integrated circuit also includes a coupling region, wherein the first and second waveguides each pass through the coupling region. One or more modulating elements are coupled to each of the first and second waveguides. The first waveguide and the second waveguide have a first facet and a second facet, respectively, and first and second reflections are generated at the first and second facets within the first and second waveguides, respectively. The one or more modulating elements coupled to each of the first and second waveguides are designed to adjust the phase of the first and second reflections before the first and second reflections pass through the coupling region.

26 Claims, 10 Drawing Sheets

(51) Int. Cl.
  *H01B 3/10* (2006.01)
  *G02B 6/122* (2006.01)
  *G02B 6/293* (2006.01)
  *G02B 6/124* (2006.01)
  *G02B 6/28* (2006.01)
  *H01S 5/10* (2006.01)

(52) U.S. Cl.
  CPC ........... *G02B 6/124* (2013.01); *G02B 6/2861* (2013.01); *G02B 6/29331* (2013.01); *G02B 6/29332* (2013.01); *G02B 6/29344* (2013.01); *G02B 6/29352* (2013.01); *H01S 5/1028* (2013.01); *G02B 2006/12104* (2013.01); *G02B 2006/12142* (2013.01); *G02B 2006/12147* (2013.01)

(56) References Cited

U.S. PATENT DOCUMENTS

| | | | |
|---|---|---|---|
| 2005/0025419 A1 | 2/2005 | Fish et al. | |
| 2011/0243491 A1* | 10/2011 | Hashimoto | G02F 1/035 385/3 |
| 2013/0336611 A1* | 12/2013 | Lee | G02F 1/025 385/2 |
| 2014/0205300 A1* | 7/2014 | Hemenway, Jr. | H04B 10/2581 398/116 |
| 2014/0368828 A1* | 12/2014 | Lloret Soler | G01B 9/02091 356/479 |
| 2015/0288148 A1* | 10/2015 | Takabayashi | H01S 5/14 372/6 |

OTHER PUBLICATIONS

Written Opinion of the International Searching Authority directed to related International Patent Application No. PCT/EP2016/055117, mailed Jun. 13, 2016; 6 pages.

English-language Abstract for Japanese Patent Publication No. JPS63160391 A, published Jul. 4, 1988; 2 pages.

* cited by examiner

BIDIRECTIONAL PHOTONIC INTEGRATED CIRCUIT WITH SUPPRESSED REFLECTION

CROSS-REFERENCE TO RELATED APPLICATIONS

This application claims the benefit of U.S. provisional application No. 62/132,038, filed Mar. 12, 2015, which is incorporated by reference herein in its entirety.

BACKGROUND

Field

Embodiments of the invention relate to designs of a photonic integrated circuit that is capable of suppressing undesirable reflections.

Background

Photonic integrated circuits are used for a wide variety of applications ranging from telecommunications to imaging. These circuits are often designed to have at least some portions that are bi-directional, where light can propagate in a forward and backward direction, sometimes within the same waveguide. This can lead to reflections that may cause undesirable effects, such as interference with other signals.

A few potential solutions have been implemented in an effort to reduce the undesirable reflections. These include tilting the facets of waveguides relative to the direction of light propagation to help reduce reflections at the air-facet interface, and applying an anti-reflective coating upon facets and other surfaces where reflections are undesirable. Such techniques may reduce the reflected radiation amplitude by as much as −40 dB. However, this level of suppression may not be enough, especially when dealing with large dynamic range detection, heterodyne mixing and/or weak input signals to be detected. Such situations are found, for example, in low-coherence interferometry setups, including optical coherence tomography (OCT) systems.

BRIEF SUMMARY

In the embodiments presented herein, device designs of a photonic integrated circuit with reflection suppression mechanisms are presented.

In an embodiment, a photonic integrated circuit includes a substrate, and a first and second waveguide patterned on the substrate. The first waveguide guides an input beam of radiation. The photonic integrated circuit also includes a coupling region, wherein the first and second waveguides each pass through the coupling region. One or more modulating elements are coupled to each of the first and second waveguides. The first waveguide and the second waveguide have a first facet and a second facet, respectively, and first and second reflections are generated at the first and second facets within the first and second waveguides, respectively. The one or more modulating elements coupled to each of the first and second waveguides are designed to adjust the phase of the first and second reflections before the first and second reflections pass through the coupling region.

In another embodiment, a photonic integrated circuit includes a substrate, and a first and second waveguide patterned on the substrate. The first waveguide guides an input beam of radiation. The photonic integrated circuit also includes a coupling region, wherein the first and second waveguides each pass through the coupling region. One or more modulating elements are coupled to each of the first and second waveguides. The first waveguide and the second waveguide have a first facet and a second facet, respectively. The photonic integrated circuit also includes one or more optical amplifying elements aligned with the first facet and the second facet, and designed to reflect amplified radiation back into the first waveguide and the second waveguide. The one or more modulating elements coupled to each of the first and second waveguides are designed to adjust the phase of the amplified radiation in the first and second waveguides before the amplified radiation passes through the coupling region.

BRIEF DESCRIPTION OF THE DRAWINGS/FIGURES

The accompanying drawings, which are incorporated herein and form a part of the specification, illustrate embodiments of the present invention and, together with the description, further serve to explain the principles of the invention and to enable a person skilled in the pertinent art to make and use the invention.

Embodiments of the present invention will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

Embodiments herein relate to various designs of a photonic integrated circuit. These circuits may be used in various imaging applications, such as for OCT, and/or may include reflective elements where undesired reflections need to be suppressed.

Herein, the terms "electromagnetic radiation," "light," "beam of radiation," and "optical beam" are all used to describe the same electromagnetic signals propagating through the various described elements and systems.

Figure 1:
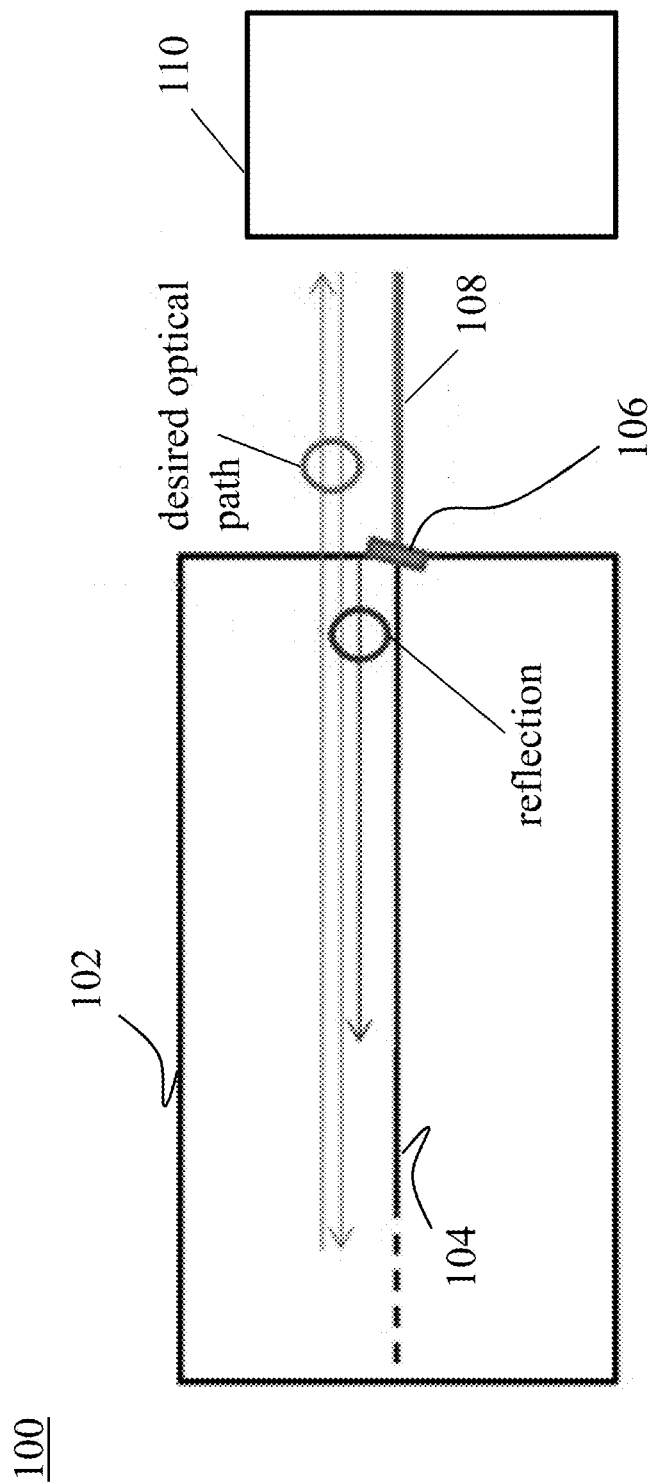
FIG. 1 illustrates a photonic integrated circuit.

FIG. 1 illustrates a photonic integrated circuit 100 having a substrate 102, and a patterned waveguide 104. Patterned waveguide 104 terminates at a facet 106 where light exits from waveguide 104 into the surrounding air. Imaging light 108 exits from facet 106 and impinges upon a sample 110. In this way, photonic integrated circuit 100 is used as part of an imaging device. Reflections from sample 110 are collected back into waveguide 104 and are ultimately detected at an optical detector (not shown) in order to generate an image of sample 110.

Using waveguide 104 to transmit both an input beam of light and the reflected light from sample 110 produces a desired optical path, as noted in FIG. 1, consisting of this input light and the reflected light. However, reflected light at facet 106 also exists within waveguide 104. This reflected light from facet 106 is undesirable as it can interfere with the desired reflection from sample 110. The reflected light from facet 106 causes degradation in the quality of the reflected light from sample 110. This problem is compounded if the reflected light from sample 110 has a relatively low amplitude, as is the case in many practical imaging applications, such as OCT.

Figure 2A:
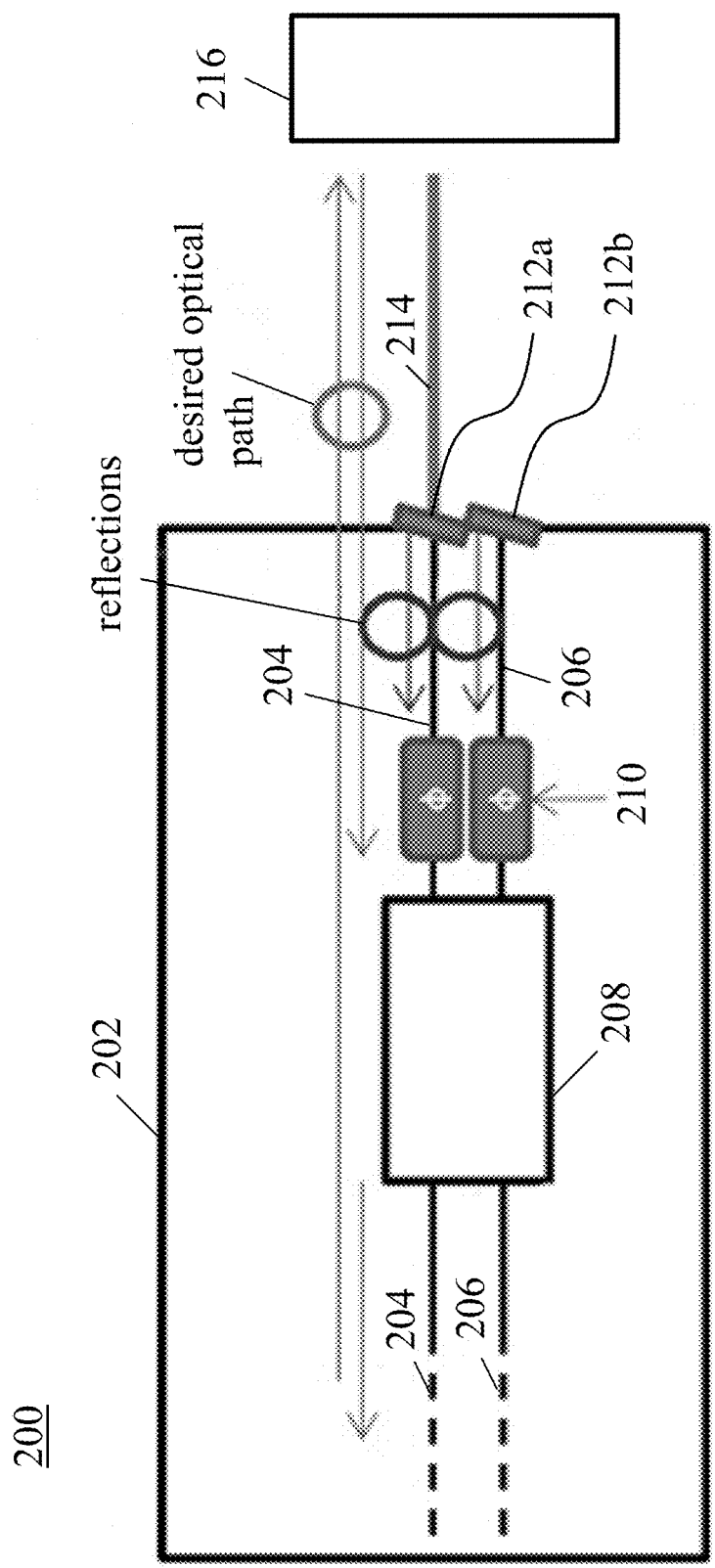
FIG. 2A illustrates a photonic integrated circuit, according to an embodiment.

FIG. 2A illustrates a photonic integrated circuit 200, according to an embodiment. Photonic integrated circuit 200 includes a substrate 202, a first waveguide 204, and a second waveguide 206. Waveguides 204 and 206 may be any type of waveguide such as a strip waveguide or a rib waveguide. Waveguides 204 and 206 may have dimensions such that only a single optical mode propagates through the core.

Waveguides 204 and 206 may be patterned in a semiconducting material such as silicon, gallium arsenide, or indium phosphide. Substrate 202 may also comprise a semiconducting material with a cladding layer beneath waveguides 204 and 206. Various layer structures and designs may be utilized to contain propagating light within the waveguides' cores, as would be understood to one skilled in the art. It should be noted that waveguides 204 and 206 are similarly labeled on both sides of coupling region 208. This is not intended to limit the design of photonic integrated circuit 200 and is used herein for the sake of clarity. In other examples, the connected waveguides on both sides of coupling region 208 may be considered as different waveguides.

Each of waveguides 204 and 206 pass through a coupling region 208, according to an embodiment. Coupling region 208 may define a hybrid coupler, such as a 2×2 evanescent coupler. Couplers having more than 2 ports (e.g., 3×3, 4×4) may be used as well. In another example, coupling region 208 includes a multimode interference (MMI) coupler. In the case of a perfectly balanced coupler, light entering from any input is split nearly 50:50 between the two outputs. Other coupler types may use different coupling ratios such as 60:40, 70:30, 80:20, and 90:10. If light is received at both inputs on one side of coupling region 208, then the light is also at least partially combined at both outputs. According to an embodiment, this light combination feature is taken advantage of to suppress reflections as discussed in more detail below.

One or more optical modulating elements 210 are disposed along each of waveguides 204 and 206, according to an embodiment. Further downstream are waveguide facets 212a and 212b, which terminate waveguides 204 and 206, respectively. As illustrated, reflections may occur at both facets 212a and 212b and propagate back upstream towards coupling region 208 along both waveguides 204 and 206. Facets 212a and 212b may be tilted with respect to a plane passing perpendicularly through substrate 202 in an effort to reduce the reflections from facets 212a and 212b. For example, the facets may be angled between 8 and 10 degrees with respect to a plane passing perpendicularly through substrate 202. A beam of illumination light 214 exits from at least one of facets 212a and 212b and impinges upon a sample 216 when being used in an imaging-type application, according to an embodiment. Thus, as noted in FIG. 2A, a desired optical path may exist that includes input light within first waveguide 204 and reflected light from sample 216 also within first waveguide 204.

In FIG. 2A, light returning from sample 216 re-enters first waveguide 204 through its corresponding facet 212a. First waveguide 204, at that point, carries input light, light reflected from facet 212a, and the desired sample light. Second waveguide 206, at that point, carries input light and light reflected from facet 212b. The light in second waveguide 206 can thus be used as a control for first waveguide 204. One or more optical modulating elements 210 may be designed to shift the phase of the reflected light. According to an embodiment, the phase of the reflected light in both waveguides 204 and 206 is shifted such that the reflected light in both waveguides constructively interfere within second waveguide 206 and destructively interfere within first waveguide 204 after passing through coupling region 208. In this way, the light reflected from facet 212a is minimized within first waveguide 204 such that it does not interfere with the desired reflected light from sample 216 in first waveguide 204.

Figure 2B:
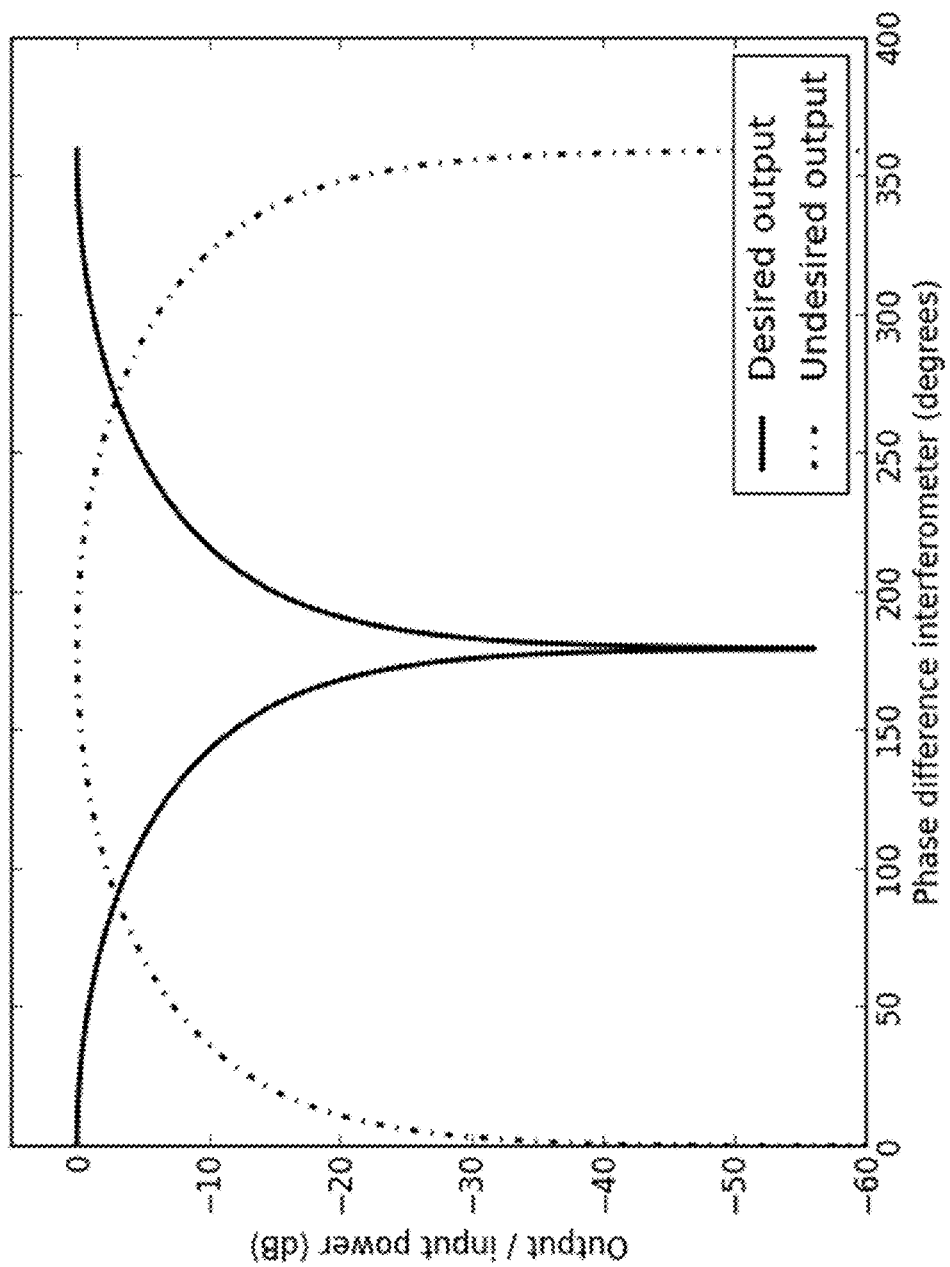
FIGS. 2B and 2C illustrate example optical simulation results.
Figure 2C:
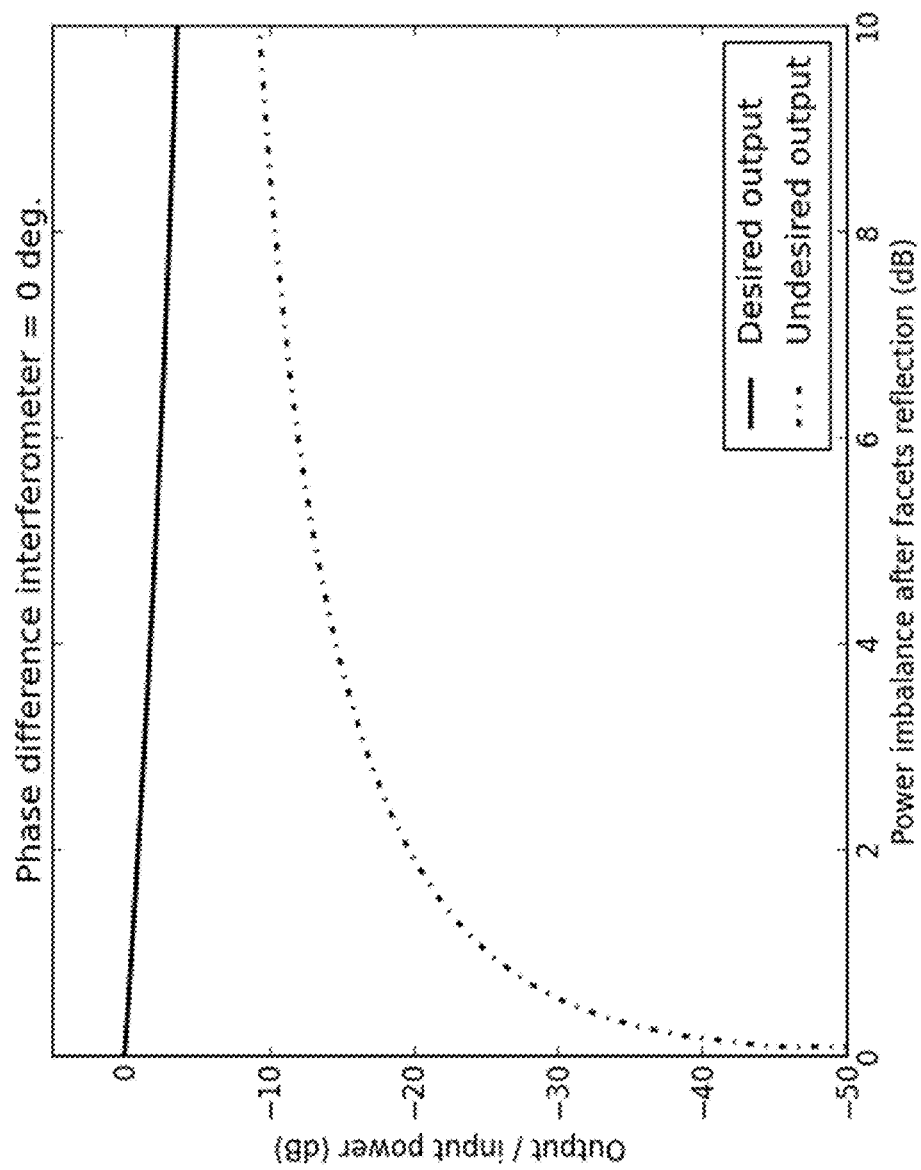

FIG. 2B illustrates back reflected light from waveguide 206 (desired output) and waveguide 204 (undesired output) related with the input light into waveguide 204. The phase difference of the reflected light in both waveguides 204 and 206 is shifted up to 360 degrees. As illustrated, with the proper phase difference, the undesired light may be eliminated. However, in real scenarios the reflected light from facets 212a and 212b is unbalanced, e.g. the power reflected is higher in one facet than another. FIG. 2C simulates an example of photonic integrated circuit 200 with unbalanced reflections. The phase difference between reflected light in both waveguides is set at 0 degrees. It is shown that the extinction ratio (power difference between the desired and undesired outputs) decreases as the power imbalance increases. Power imbalances between 1-2 dB are often seen in the industry, which yield to extinction ratios around 20 dB. For an OCT application, extinction ratios above the effective dynamic range (~40-50 dB) may be desired.

In another embodiment, reflections may be generated within an optical circuit from certain elements such as tapered regions of waveguides and 90° mirrors. Different modulating elements may need to be introduced between such reflecting elements and any couplers to separately cancel the unwanted reflections.

In another embodiment, unwanted back-reflections may be directed to the same coupler port where the output radiation entered the structure. Then, the other port will be free of reflections and it may be used to access clean input radiation. In an OCT system, for example, this could be assimilated in a transmission configuration where the feed and collection waveguides become separated.

One or more optical modulating elements 210 may include passive elements for shifting the phase. Such passive elements may include one or more waveguide loops for altering the path length. Gratings, such as Bragg gratings, may also be fabricated within the waveguides to alter the phase. In another example, one or more optical modulating elements 210 may include active elements such as thermal-optical modulators or electro-optical modulators for shifting the phase of the light within one or both of waveguides 204 and 206.

Figure 3A:
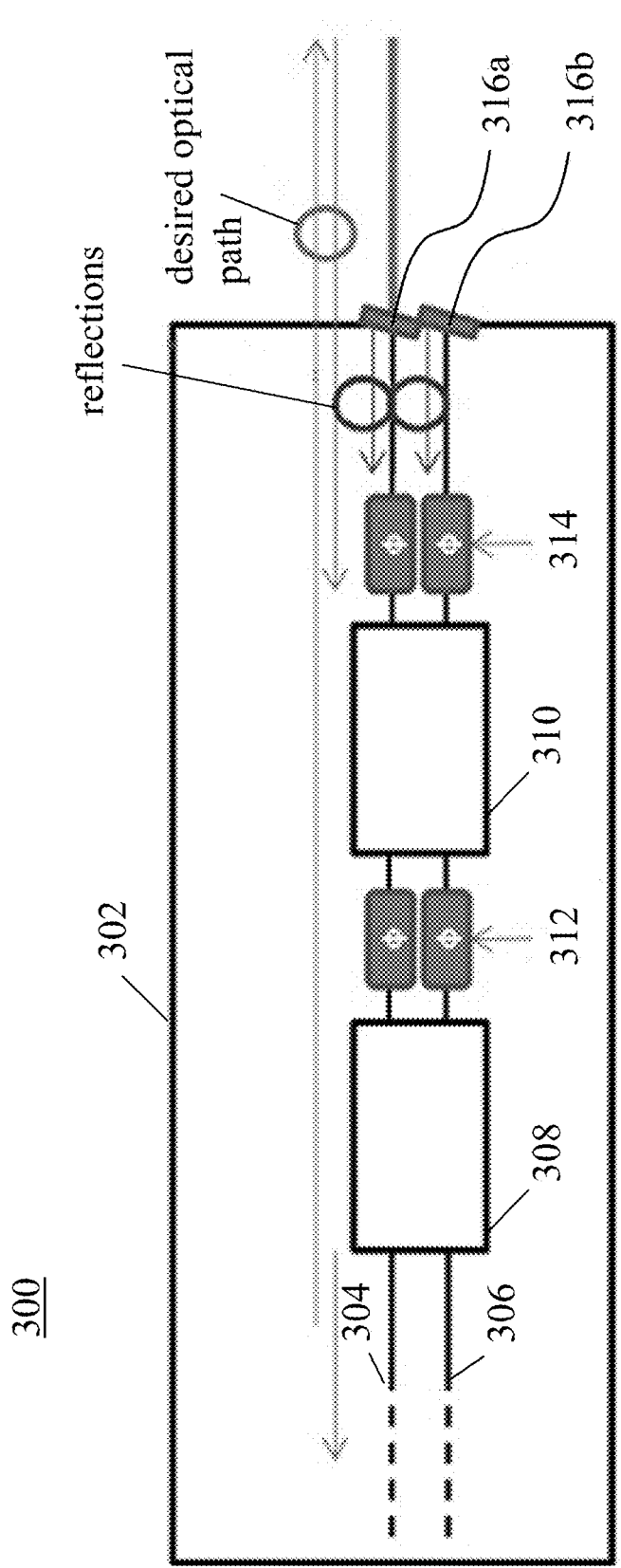
FIG. 3A illustrates a photonic integrated circuit, according to an embodiment.

FIG. 3A illustrates a photonic integrated circuit 300, according to another embodiment. Photonic integrated circuit 300 includes many similar elements to photonic integrated circuit 200, including substrate 302, first and second waveguides 304 and 306, and end facets 316a and 316b. However, rather than using a single coupling region, photonic integrated circuit 300 includes a first coupling region 308 and a second coupling region 310 arranged in cascade, according to an embodiment. A second set of one or more optical modulating elements 312 may be added between first coupling region 308 and second coupling region 310. Similar to photonic integrated circuit 200, a first set of one or more optical modulating elements 314 is provided between second coupling region 310 and end facets 316a and 316b.

In an embodiment, first coupling region 308 and second coupling region 310 are arranged as a Mach-Zehnder interferometer. This may allow for power to be accurately balanced between both first waveguide 304 and second waveguide 306 using second set of one or more optical modulating elements 312, while phase may be independently controlled in the waveguide segments using first set of one or more optical modulating elements 314. This approach may also be used to compensate for inaccuracies in fabrication, imperfect cleaning, or coupler imbalance. Higher order implementations may also be considered for further compensation of imbalance over a given wavelength range, or in different polarization states. The overall operation of photonic integrated circuit 300 is similar to that of photonic integrated circuit 200, where reflections from end facets 316a and 316b are effectively cancelled out by adjusting their phase using one or more optical modulating elements 314.

Figure 3B:
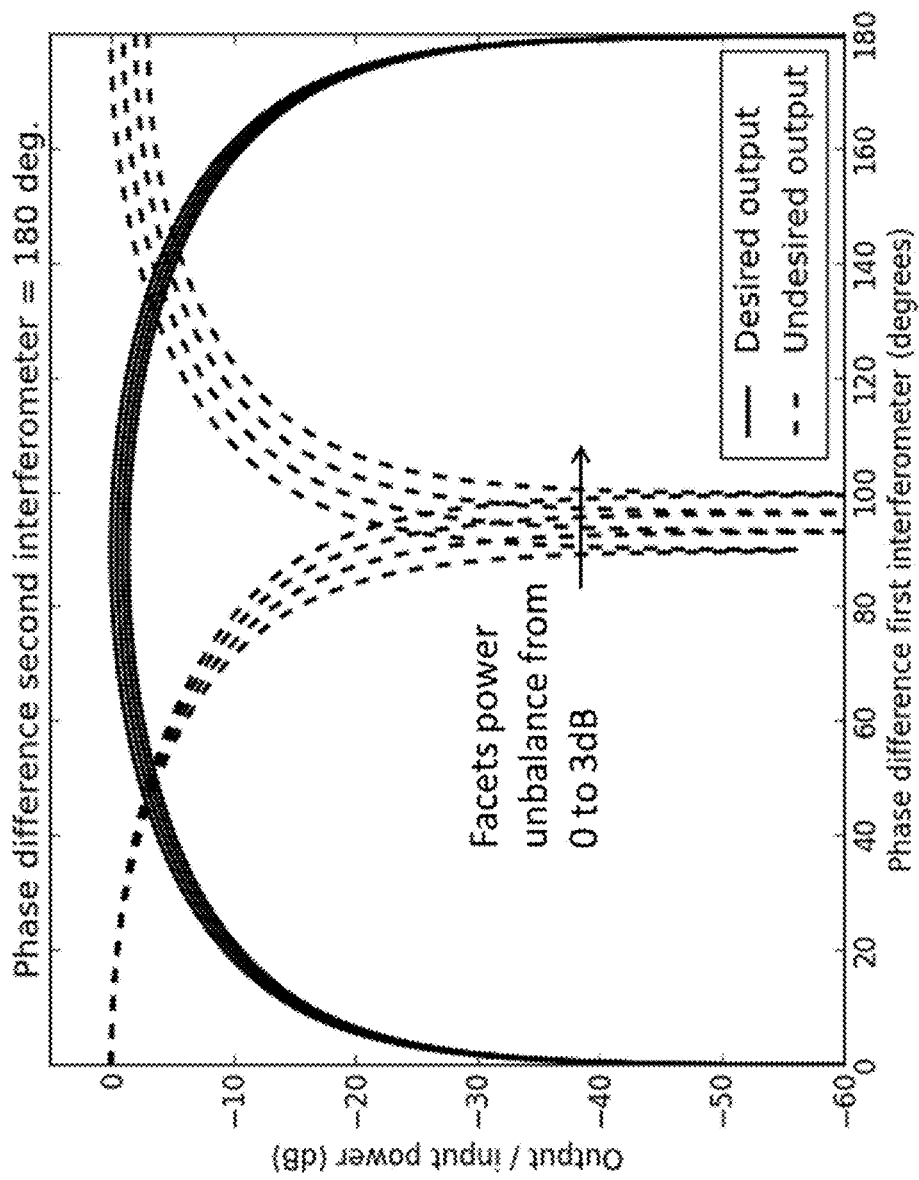
FIG. 3B illustrates example optical simulation results.

FIG. 3B shows back reflected light from waveguide 306 (desired output) and waveguide 304 (undesired output) related with the input light into waveguide 304. The phase difference of for example, modulating element 312, is shifted up to 180 degrees. The phase difference of, for example, modulating element 314, is set at 180 degrees, in order to achieve a maximum extinction ratio between the desired and undesired output. As illustrated, assuming perfectly balanced facet reflections, 90 degrees is needed to maximize the system performance. Nevertheless, the phase difference must be adjusted if an unbalance appears. It can be seen that the optimum phase difference increased up to 100 degrees for a facet reflection unbalance of 3 dB. In this case, the extinction rate may be maximized for any facet unbalance.

Embodiments described herein for suppressing unwanted reflections are usable in many different applications, and are not limited to only imaging systems. For example, unwanted reflections also occur when using optical amplifying elements in a photonic integrated circuit.

Figure 4:
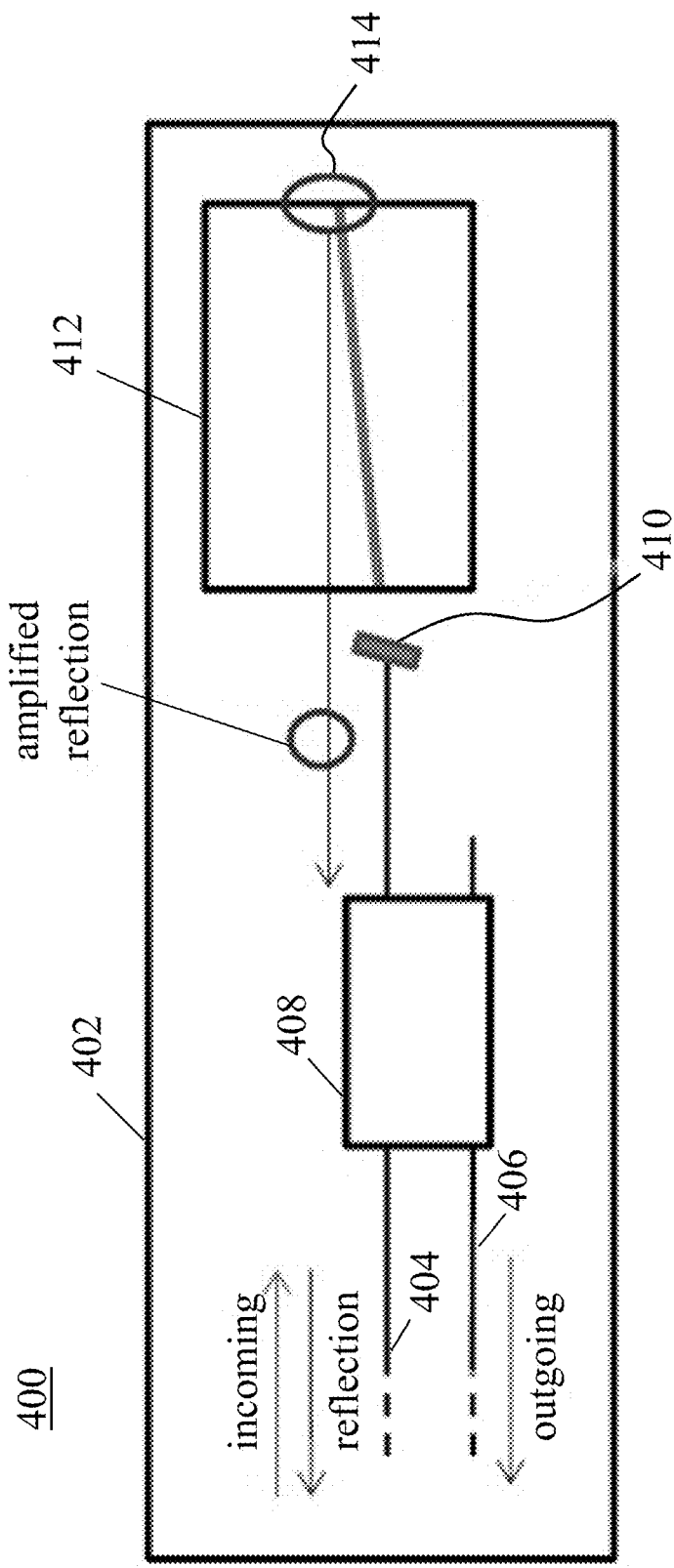
FIG. 4 illustrates a photonic integrated circuit.

FIG. 4 illustrates a photonic integrated circuit 400 having a substrate 402 with a first patterned waveguide 404 and a second patterned waveguide 406. Waveguides 404 and 406 pass through a coupling region 408, and first waveguide 404 terminates with a facet 410. Aligned with facet 410 is an optical amplifying element 412 which amplifies the input light from first patterned waveguide 404 by reflecting the light through an active gain region. Reflective coating 414 may be applied within optical amplifying element 412 to reflect a majority of the light back through the active gain region. The reflected light is eventually input back into first waveguide 404 where it propagates back towards coupling region 408.

The problem with this design occurs when the amplified light is coupled back through coupling region 408 and into first waveguide 404 and second waveguide 406. Ideally, one would desire all of the amplified light to couple into second waveguide 406. But in practice, at least a portion of the amplified light couples back into waveguide 404 which interferes with the input light. In fact, this situation is especially inconvenient when implemented in an OCT system, since propagation direction of the light separates excitation light from collected back-reflections from a sample. Trying to amplify the back-reflections would require a coupler and would result in mixing both propagation directions after amplification.

Figure 5:
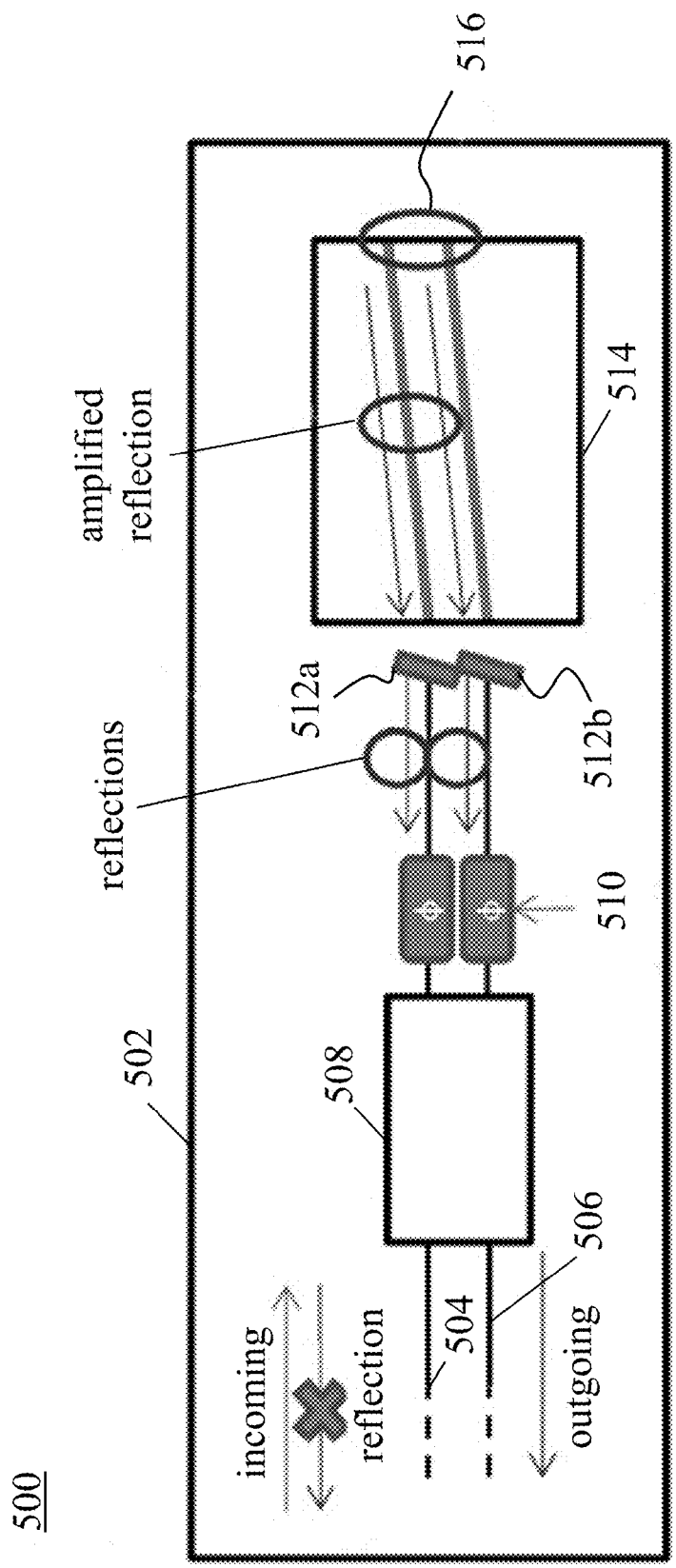
FIG. 5 illustrates a photonic integrated circuit, according to an embodiment.

FIG. 5 illustrates a photonic integrated circuit 500 according to an embodiment. Photonic integrated circuit 500 includes many similar elements to the previously described photonic integrated circuits 200 and 300. Elements such as substrate 502, first and second waveguides 504 and 506, coupling region 508, optical modulators 510, and facets 512a and 512b will not be described again in detail, except as they apply to this embodiment using an optical amplifier 514. An example of optical amplifier 514 is a semiconductor optical amplifier (SOA).

Optical amplifier 514 may be a single element aligned to both facets 512a and 512b, or it may include two separate amplifying units coupled to each facet, respectively. Optical amplifier 514 may include a reflective coating 516 to increase the amount of reflected light within an active gain region of optical amplifier 514. Eventually, amplified light will couple back into first waveguide 504 and second waveguide 506. As illustrated in FIG. 5, reflections will also occur from facets 512a and 512b.

Ideally, the amplified light propagating back towards coupling region 508 in each of first waveguide 504 and second waveguide 506 is the same. This would theoretically occur if coupler region 508 was perfectly balanced, the amplification occurring for both beams being fed back into first waveguide 504 and second waveguide 506 is identical and equally biased, and the quality of optical coupling is equal at both interfaces. However, in practice, this situation is nearly impossible to produce. One or more optical modulating elements 510 may be implemented to shift the phase of the reflected, amplified light. According to an embodiment, the phase of the reflected light in both waveguides 504 and 506 is shifted such that the reflected light in both waveguides constructively interfere within second waveguide 506 and destructively interfere within first waveguide 504 after passing through coupling region 508. In this way, the amplified light does not interfere with the input light in first waveguide 504.

Optical amplifier 514 may be integrated within substrate 502. In this way, the same etching steps may be performed when fabricating the device to define both waveguides 504 and 506 as well as the gain region of optical amplifier 514. This monolithic integration allows for very good alignment between facets 512a and 512b and optical amplifier 514. In another example, optical amplifier 514 may be fabricated on a separate substrate and bonded to substrate 502. This may allow for the creation of a very high gain region when using particular materials better suited for optical amplifier 514, but may make alignment with facets 512a and 512b more difficult. Reflected light may be amplified within optical amplifier 514 using methods well known to one skilled in the art, such as optical or electrical pumping.

Figure 6:
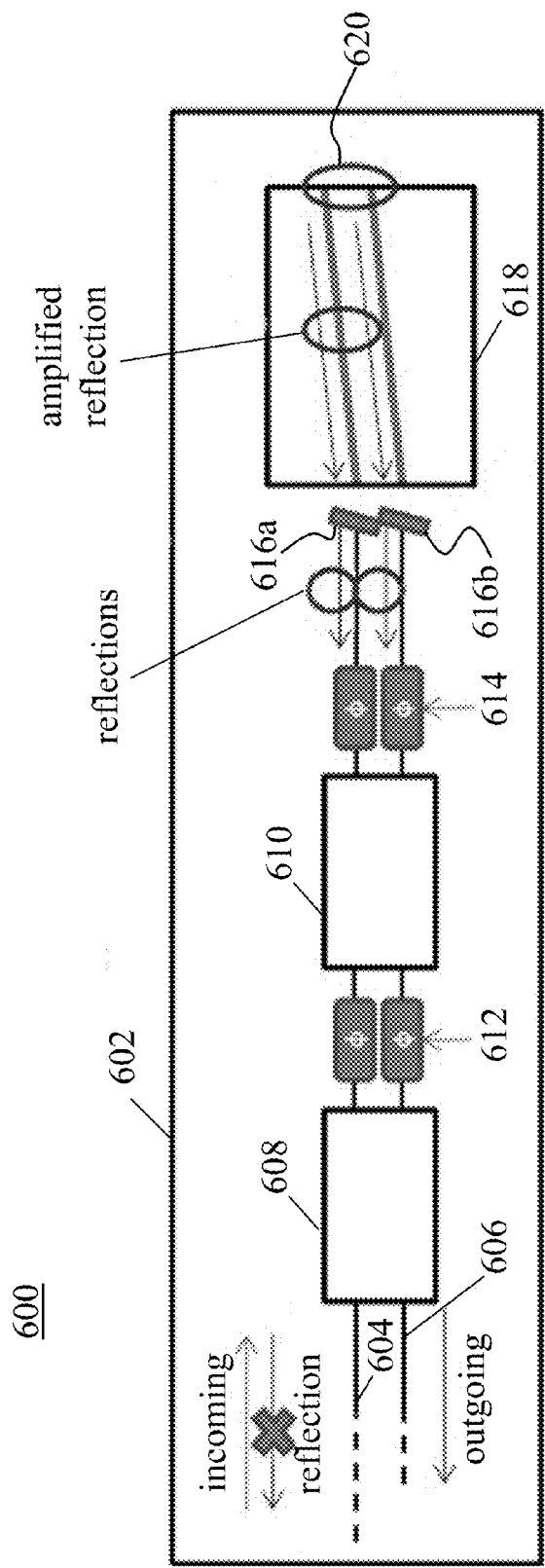
FIG. 6 illustrates a photonic integrated circuit, according to an embodiment.

FIG. 6 illustrates a photonic integrated circuit 600 according to an embodiment. Photonic integrated circuit 600 shares many similarities with photonic integrated circuit 300 except for the inclusion of optical amplifier 618. Like photonic integrated circuit 300, photonic integrated circuit 600 has substrate 602, first waveguide 604, second waveguide 606, first coupling region 608, second coupling region 610, first set of optical modulating elements 614 and second set of optical modulating elements 612. End facets 616a and 616b are aligned with optical amplifier 618.

In an embodiment, first coupling region 608 and second coupling region 610 are arranged as a Mach-Zehnder interferometer. This may allow for power to be accurately balanced between both first waveguide 604 and second waveguide 606 using second set of optical modulating elements 612, while phase may be independently controlled in the waveguide segments using first set of one or more optical modulating elements 614. Alternatively, this arrangement has an advantage of being capable of directing reflections from facets 616a and 616b separately from reflected light that was amplified in optical amplifier 618. For example, the reflections from facets 616a and 616b may have their phase adjusted to only be output at waveguide 604 after passing through both first coupling region 608 and second coupling region 610 while the amplified reflections may have their phase adjusted to only be output at waveguide 606 after passing through both first coupling region 608 and second coupling region 610. This approach may also be used to compensate for inaccuracies in fabrication, imperfect cleaning or coupler imbalance. Higher order implementations may also be considered for further compensation of imbalance over a given wavelength range, or in different polarization states.

Figure 7:
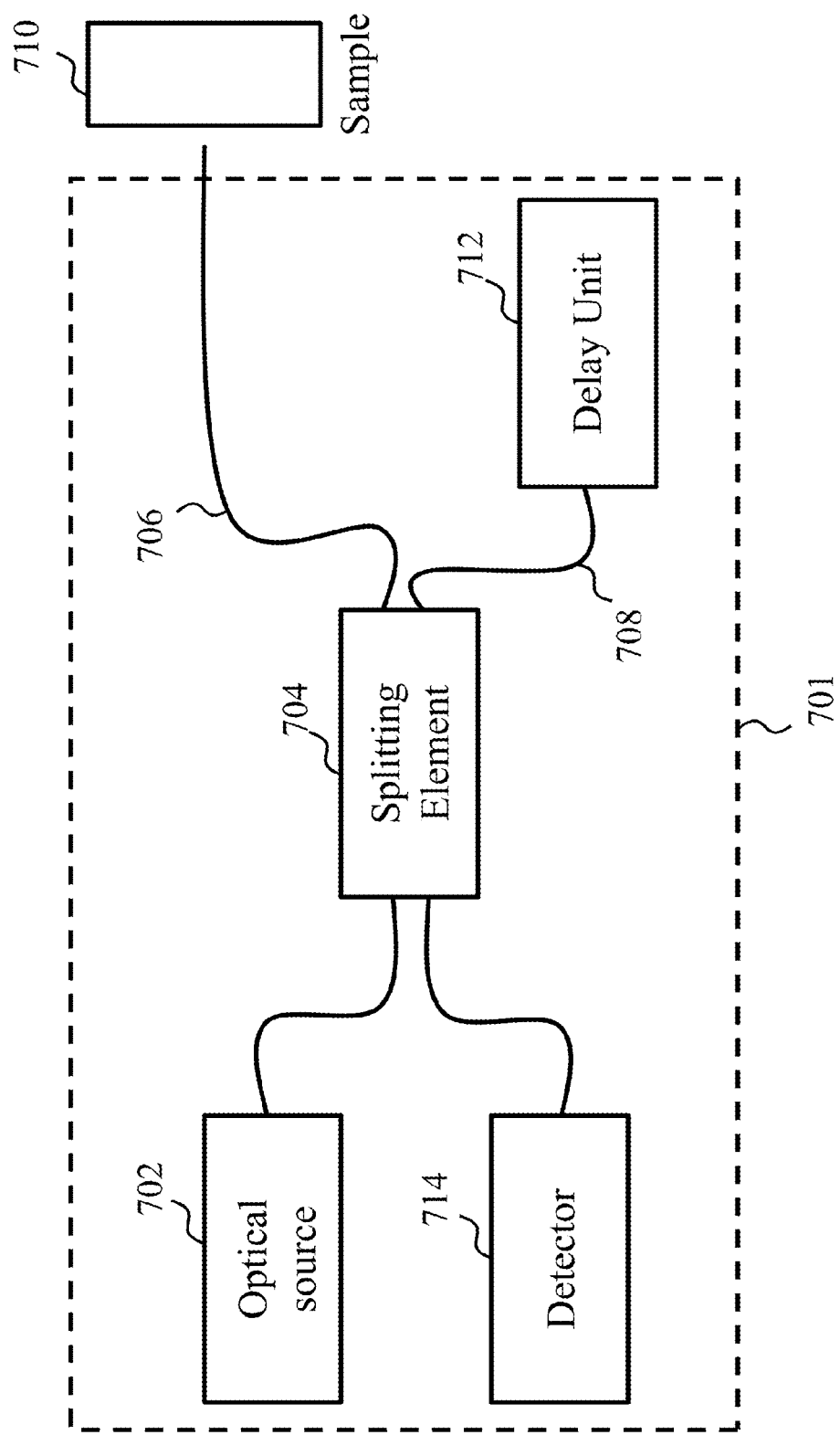
FIG. 7 illustrates a block diagram of an interferometric system, according to an embodiment.

An example interferometer arrangement that may be used to perform OCT on a sample is illustrated in FIG. 7. Various embodiments of an optical integrated circuit as illustrated in FIGS. 2-3 and 5-6 may be included within OCT system 701 to help mitigate the effects of undesirable reflections that would degrade the signal received at the detector. OCT system 701 includes an optical source 702, a splitting element 704, a sample arm 706, a reference arm 708, a delay unit 712, and a detector 714. Delay unit 712 may include various light modulating elements. These modulating elements may perform phase and/or frequency modulation to counteract undesired optical effects in the light, and to select one or more depths of sample 710 to be imaged. The use of the term "light" may refer to any range of the electromagnetic spectrum. In an embodiment, the term "light" refers to infrared radiation at a wavelength of about 1.3 µm.

In the embodiment shown, delay unit 712 is located within reference arm 708. However, it should be understood that delay unit 712 may instead be located in sample arm 706. Alternatively, various elements of delay unit 712 may be present in both sample arm 706 and reference arm 708. For example, elements of delay unit 712 that introduce a variable delay to the light may be located in sample arm 706, while elements that modulate different polarization modes of the light may be located in reference arm 708. In one example, sample arm 706 and reference arm 708 are optical waveguides, such as patterned waveguides or optical fibers. In an embodiment, all of the components of OCT system 701 are integrated onto a planar lightwave circuit (PLC). In another embodiment, at least the components within delay unit 712 are integrated on the same substrate of an optical integrated circuit. Other implementations may be considered as well, such as, for example, fiber optic systems, free-space optical systems, photonic crystal systems, etc.

It should be understood that OCT system 701 may include any number of other optical elements not shown for the sake of clarity. For example, OCT system 701 may include mirrors, lenses, gratings, splitters, micromechanical elements, etc., along the paths of sample arm 706 or reference arm 708.

Splitting element 704 is used to direct light received from optical source 702 to both sample arm 706 and reference arm 708. Splitting element 704 may be, for example, a bi-directional coupler, an optical splitter, or any other modulating optical device that converts a single beam of light into two or more beams of light. Splitting element 704 may incorporate, for example, one or more photonic circuits described with respect to FIGS. 2A, 3A, 5, and 6.

Light that travels down sample arm 706 ultimately impinges upon sample 710. In an embodiment, sample arm 706 includes a waveguide that guides the light towards one or more of addressable elements 902. Sample 710 may be any suitable sample to be imaged, such as tissue. The light scatters and reflects back from various depths within sample 710, and the scattered/reflected radiation is collected back into sample arm 706. In another embodiment, the scattered/reflected radiation is collected back into a different waveguide than the transmitting waveguide. The scan depth may be chosen via the delay imposed on the light within delay unit 712.

Light within sample arm 706 and reference arm 708 is recombined before being received at detector 714. In the embodiment shown, the light is recombined by splitting element 704. In another embodiment, the light is recombined at a different optical coupling element than splitting element 704. Detector 714 may include any number of photodiodes, charge-coupling devices, and/or CMOS structures to transduce the received light into an electrical signal. The electrical signal contains depth-resolved optical data related to sample 710 and may be received by a processing device for further analysis and signal processing procedures. As used herein, the term "depth-resolved" defines data in which one or more portions of the data related to specific depths of an imaged sample can be identified.

Optical source 702 may include one or more light emitting diodes (LEDs) or laser diodes. For example, LEDs may be used when performing time domain and/or spectral domain analysis, while tunable lasers may be used to sweep the wavelength of the light across a range of wavelengths.

OCT system 701 is illustrated as an interferometer design similar to a Michelson interferometer, according to an embodiment. However, other interferometer designs are possible as well, including Mach-Zehnder or Mireau interferometer designs.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A photonic integrated circuit, comprising:
   a substrate;
   a first waveguide patterned upon the substrate and configured to guide an input beam of radiation;
   a second waveguide patterned upon the substrate;
   a coupling region, wherein the first and second waveguides each pass through the coupling region;
   one or more modulating elements coupled to each of the first and second waveguides; and
   a first facet at an end of the first waveguide and a second facet at an end of the second waveguide, wherein first and second reflections are generated at the first and second facets within the first and second waveguides, respectively,
   wherein the one or more modulating elements coupled to each of the first and second waveguides are configured to adjust the phase of the first and second reflections before the first and second reflections pass through the coupling region, and
   wherein the input beam of radiation exits from the first facet of the first waveguide and impinges upon a sample, and reflections from the sample are collected back into the first waveguide.

2. The photonic integrated circuit of claim 1, wherein the one or more modulating elements are configured to adjust the phase of the first and second reflections such that the first and second reflections constructively interfere within the second waveguide and destructively interfere within the first waveguide after passing through the coupling region.

3. A photonic integrated circuit, comprising:
   a substrate;
   a first waveguide patterned upon the substrate and configured to guide an input beam of radiation;
   a second waveguide patterned upon the substrate;
   a coupling region, wherein the first and second waveguides each pass through the coupling region;
   one or more modulating elements coupled to each of the first and second waveguides; and
   a first facet at an end of the first waveguide and a second facet at an end of the second waveguide, wherein first and second reflections are generated at the first and second facets within the first and second waveguides, respectively,
   wherein the one or more modulating elements coupled to each of the first and second waveguides are configured to adjust the phase of the first and second reflections before the first and second reflections pass through the coupling region, and
   wherein the first facet and the second facet are angled between 8 and 10 degrees with respect to a plane passing perpendicularly through the substrate.

4. The photonic integrated circuit of claim 1, wherein the coupling region is a 2×2 bi-directional coupler.

5. The photonic integrated circuit of claim 4, wherein the coupling region is configured to evanescently couple radiation between the first waveguide and the second waveguide.

6. The photonic integrated circuit of claim 1, wherein the one or more modulating elements include passive phase shifting elements.

7. The photonic integrated circuit of claim 1, wherein the one or more modulating elements include thermal-optical modulators.

8. The photonic integrated circuit of claim 1, wherein the one or more modulating elements include electro-optical modulators.

9. The photonic integrated circuit of claim 1, further comprising:
   a second coupling region in cascade with the first coupling region.

10. The photonic integrated circuit of claim 9, wherein the first coupling region and the second coupling region are configured together to form a Mach-Zehnder interferometer.

11. The photonic integrated circuit of claim 9, further comprising:
    a second set of one or more modulating elements coupled to each of the first and second waveguides and between the first and second coupling regions.

12. A photonic integrated circuit, comprising:
    a substrate;
    a first waveguide patterned upon the substrate and configured to guide an input beam of radiation;
    a second waveguide patterned upon the substrate;
    a coupling region, wherein the first and second waveguides each pass through the coupling region;
    one or more modulating elements coupled to each of the first and second waveguides;
    a first facet at an end of the first waveguide and a second facet at an end of the second waveguide; and
    one or more optical amplifying elements aligned with the first facet and the second facet, and configured to reflect amplified radiation back into the first waveguide and the second waveguide,
    wherein the one or more modulating elements coupled to each of the first and second waveguides are configured to adjust the phase of the amplified radiation in the first and second waveguides before the amplified radiation passes through the coupling region.

13. The photonic integrated circuit of claim 12, wherein the one or more modulating elements are configured to adjust the phase of the amplified radiation in the first and second waveguides such that the amplified radiation constructively interfere within the second waveguide and destructively interfere within the first waveguide after passing through the coupling region.

14. The photonic integrated circuit of claim 12, wherein the coupling region is a 2×2 bi-directional coupler.

15. The photonic integrated circuit of claim 14, wherein the coupling region is configured to evanescently couple radiation between the first waveguide and the second waveguide.

16. The photonic integrated circuit of claim 12, wherein the coupling region is a multimode interference (MMI) coupler.

17. The photonic integrated circuit of claim 12, wherein the one or more modulating elements include passive phase shifting elements.

18. The photonic integrated circuit of claim 12, wherein the one or more modulating elements include thermal-optical modulators.

19. The photonic integrated circuit of claim 12, wherein the one or more modulating elements include electro-optical modulators.

20. The photonic integrated circuit of claim 12, further comprising:
a second coupling region in cascade with the first coupling region.

21. The photonic integrated circuit of claim 20, wherein the first coupling region and the second coupling region are configured together to form a Mach-Zehnder interferometer.

22. The photonic integrated circuit of claim 20, further comprising:
a second set of one or more modulating elements coupled to each of the first and second waveguides and between the first and second coupling regions.

23. The photonic integrated circuit of claim 12, wherein the one or more optical amplifying elements comprises a semiconductor optical amplifier (SOA).

24. The photonic integrated circuit of claim 12, wherein the one or more optical amplifying elements is integrated on the substrate.

25. The photonic integrated circuit of claim 12, wherein the one or more optical amplifying elements is provided on a second substrate that is bonded to the substrate.

26. The photonic integrated circuit of claim 1, wherein the coupling region is a multimode interference (MMI) coupler.

* * * * *